(12) United States Patent
Dusa et al.

(10) Patent No.: US 7,916,284 B2
(45) Date of Patent: Mar. 29, 2011

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Mircea Dusa, Campbell, CA (US); Arie Jeffrey Den Boef, Waalre (NL); Hugo Augustinus Joseph Cramer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 434 days.

(21) Appl. No.: 11/488,170

(22) Filed: Jul. 18, 2006

(65) Prior Publication Data

US 2008/0018874 A1    Jan. 24, 2008

(51) Int. Cl.
| | |
|---|---|
| G01B 9/00 | (2006.01) |
| G01B 11/30 | (2006.01) |
| G01B 11/14 | (2006.01) |
| G01B 11/04 | (2006.01) |
| G03F 9/00 | (2006.01) |
| G03C 5/00 | (2006.01) |

(52) U.S. Cl. ........ 356/124; 356/125; 356/601; 356/625; 356/636; 430/22; 430/30

(58) Field of Classification Search .................. None
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |

(Continued)

FOREIGN PATENT DOCUMENTS

EP    1 628 164 A2    2/2006

(Continued)

OTHER PUBLICATIONS

Written Opinion and Search Report for Singapore Application No. SG 200704170-0 mailed Sep. 26, 2008, 7 pgs.

(Continued)

*Primary Examiner* — Tarifur Chowdhury
*Assistant Examiner* — Gordon J Stock, Jr.
(74) *Attorney, Agent, or Firm* — Sterne, Kessler, Goldstein & Fox P.L.L.C.

(57) ABSTRACT

In a scatterometric method differential targets with different sensitivities to parameters of interest are printed in a calibration matrix and difference spectra obtained. principal component analysis is applied to the difference spectra to obtain a calibration function that is less sensitive to variations in the underlying structure than a calibration function obtained from spectra obtained from a single target.

12 Claims, 8 Drawing Sheets

U.S. PATENT DOCUMENTS

| | | |
|---|---|---|
| 6,974,962 B2 | 12/2005 | Brill et al. ............... 250/548 |
| 6,987,572 B2 | 1/2006 | Lakkapragada et al. ...... 356/601 |
| 7,046,376 B2 | 5/2006 | Sezginer ............... 356/601 |
| 7,061,615 B1 | 6/2006 | Lowe-Webb ............... 356/401 |
| 7,061,623 B2 | 6/2006 | Davidson ............... 356/497 |
| 7,061,627 B2 | 6/2006 | Opsal et al. ............... 356/601 |
| 7,068,363 B2 | 6/2006 | Bevis et al. ............... 356/237.5 |
| 7,352,453 B2* | 4/2008 | Mieher et al. ............... 356/125 |
| 2003/0104292 A1 | 6/2003 | Tomimatu |
| 2004/0070771 A1* | 4/2004 | Ausschnitt ............... 356/625 |
| 2004/0114132 A1 | 6/2004 | Den Boef et al. |
| 2004/0119970 A1 | 6/2004 | Dusa et al. |
| 2004/0190008 A1 | 9/2004 | Mieher et al. |
| 2005/0106479 A1* | 5/2005 | Geh et al. ............... 430/30 |
| 2005/0185174 A1 | 8/2005 | Laan et al. |
| 2006/0033921 A1 | 2/2006 | Den Boef et al. ............... 356/446 |
| 2006/0066855 A1 | 3/2006 | Den Boef et al. ............... 356/401 |
| 2006/0126074 A1 | 6/2006 | Van Der Werf et al. ...... 356/489 |
| 2006/0139592 A1 | 6/2006 | Den Boef et al. ............... 355/53 |
| 2007/0003840 A1* | 1/2007 | Van Der Schaar et al. ....... 430/5 |

FOREIGN PATENT DOCUMENTS

| | | |
|---|---|---|
| JP | 7-326563 A | 12/1995 |
| JP | 8-264409 A | 10/1996 |
| JP | 10-154647 A | 6/1998 |
| JP | 2003-168641 A | 6/2003 |
| JP | 2006-040951 A | 2/2006 |
| WO | WO 2005/081069 A1 | 9/2005 |

OTHER PUBLICATIONS

Notice of Reasons for Rejection mailed Aug. 26, 2010 for Japanese Patent Application No. 2007-181810, 3 pgs.

* cited by examiner

INSPECTION METHOD AND APPARATUS, LITHOGRAPHIC APPARATUS, LITHOGRAPHIC PROCESSING CELL AND DEVICE MANUFACTURING METHOD

BACKGROUND OF THE INVENTION

1. Field of the Invention

The present invention relates to methods of inspection usable, for example, in the manufacture of devices by lithographic techniques and to methods of manufacturing devices using lithographic techniques.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various inspection tools. One form of inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle. Principal component analysis is a known method used to obtain, for example, focus, dose and optionally contrast information from scatterometry data without the need for a computationally-intensive reconstruction of the target being measured. This is achieved by printing a calibration array of targets on a test substrate at different dose, focus and optionally contrast values. Scatterometry measurements are then performed on each target in the array. The measurement results are then decomposed into a set of orthogonal basis functions—known as the principal component functions, which depend on the target pattern used and coefficient values, known as the principal component values. Statistical techniques can then be used to establish a relationship between the nominal focus, dose and optionally contrast values used to print the targets and the principal component values. To derive focus, dose and optionally contrast values for a target printed in a production target, it is only necessary to make a scatterometry measurement, determine the principal component values and apply the derived relationship. Further details of this technique can be found in U.S. Patent Application Publication 2005/0185174 A1, which is hereby incorporated in its entirety by reference.

The relationship between the principal component values and focus, dose and contrast values is dependent on the structure underlying the target. Thus, the calibration array must be printed and measured in each layer in which targets are to be measured in each manufacturing process, it is not possible to reuse the relationship derived from one layer in one process in a different layer or process.

A limitation of the principal component analysis technique is that unintended variations in the underlying structure, e.g. layer thickness variations, between the calibration substrate and the substrate being measured can lead to significant errors.

SUMMARY OF THE INVENTION

It is desirable to provide a method of determining from scatterometry data parameters of a target structure which is less sensitive to variations in the underlying structure.

According to an embodiment of the invention, a method of measuring a parameter of a lithographic process by which a target pattern has been printed on a substrate comprises projecting an image of a reference pattern onto a radiation-sensitive layer of a calibration substrate a plurality of times to form by the lithographic process a plurality of calibration patterns, wherein different values of the parameter are used to form different ones of the calibration patterns and the reference pattern comprises first and second parts having different sensitivities to variation in the value of the parameter; directing an inspection beam of radiation onto the calibration patterns and measuring the radiation reflected or scattered therefrom to obtain a measurement result for each part of each calibration pattern; subtracting the measurement result for the first part of each calibration pattern from the measurement result for the second part of the respective calibration pattern to obtain a plurality of differential measurement results; decomposing each of the differential measurement results into a set of basis functions and associated coefficients and obtaining a relationship between values of the coefficients and values of the parameter; projecting an image of the reference pattern onto a radiation-sensitive layer of a substrate to form a target pattern, wherein the value of the parameter used to form the target pattern is unknown; directing an inspection beam of radiation onto the target pattern and measuring the radiation reflected or scattered therefrom to obtain a target measurement result for each part of the target pattern; subtracting the target measurement result for the first part of the target pattern from the target measurement result for the second part of the target pattern to obtain a target differential measurement result; decomposing the target differential measurement result into a set of coefficients multiplying a plurality of basis functions and using the relationship between values of the coefficients and values of the parameter to determine the value of the parameter used to form the target pattern.

According to an embodiment of the invention, a method of obtaining a calibration function for use in measuring a parameter of a lithographic process by which a target pattern has been printed on a substrate comprises projecting an image of a reference pattern onto a radiation-sensitive layer of a calibration substrate a plurality of times to form by the lithographic process a plurality of calibration patterns, wherein different values of the parameter are used to form different ones of the calibration patterns and the reference pattern comprises first and second parts having different sensitivities to variation in the value of the parameter; directing an inspection beam of radiation onto the calibration patterns and measuring the radiation reflected or scattered therefrom to obtain a measurement result for each part of each calibration pattern; subtracting the measurement result for the first part of each calibration pattern from the measurement result for the second part of the respective calibration pattern to obtain a plurality of differential measurement results; decomposing each of the differential measurement results into a set of basis functions and associated coefficients and obtaining a relationship between values of the coefficients and values of the parameter as the calibration function.

According to an embodiment of the invention, a method of measuring a parameter of a lithographic process by which a target pattern has been printed on a substrate, wherein the reference pattern comprises first and second parts having different sensitivities to variation in the value of the parameter, comprises directing an inspection beam of radiation onto the target pattern and measuring the radiation reflected or scattered therefrom to obtain a target measurement result for each part of the target pattern; subtracting the target measurement result for the first part of the target pattern from the target measurement result for the second part of the target pattern to obtain a target differential measurement result; decomposing the target differential measurement result into a set of basis functions and associated coefficients and using a calibration function expressing the relationship between values of the coefficients and values of the parameter to determine the value of the parameter used to form the target pattern.

According to an embodiment of the invention, a device manufacturing method comprises projecting an image of a device pattern and a reference pattern onto a radiation-sensitive layer of a substrate to form a device layer including device structures and a target pattern using a lithographic process, wherein the reference pattern comprises first and second parts having different sensitivities to variation in the value of a parameter of the lithographic process; directing an inspection beam of radiation onto the target pattern and measuring the radiation reflected or scattered therefrom to obtain a target measurement result for each part of the target pattern; subtracting the target measurement result for the first part of the target pattern from the target measurement result for the second part of the target pattern to obtain a target differential measurement result; decomposing the target differential measurement result into a set of coefficients multiplying a plurality of basis functions and using a calibration function expressing the relationship between values of the coefficients and values of the parameter to determine the value of the parameter used to form the target pattern.

According to an embodiment of the invention, a method of inspecting a device layer manufactured by a lithographic process to determine the value of a parameter of the lithographic process comprises including in the device layer a target pattern comprising two parts having different sensitivities to the parameter; using a scatterometer to obtain scatterometric spectra of the two parts; obtaining a difference spectrum from the two scatterometric spectra; applying a regression analysis to the difference spectrum to obtain at least one coefficient; deriving a value for the parameter from the coefficient using a calibration function obtained by printing copies of the target pattern using a plurality of different values of the parameter and applying regression analysis to difference spectra obtained from the copies of the target pattern.

According to an embodiment of the invention, an inspection apparatus configured to determine the value of a parameter of a lithographic process used to manufacture a device layer on a substrate, wherein the device layer includes a reference pattern that comprises first and second parts having different sensitivities to variation in the value of the parameter, comprises an illumination optical system configured to direct an inspection beam of radiation on to each part of the reference pattern; a projection optical system configured to project radiation reflected or scattered by each part of the reference pattern onto a detector to obtain scatterometric spectra of the two parts; a spectrum subtractor configured to obtain a difference spectrum from the two scatterometric spectra; an analyzer configured to apply a regression analysis to the difference spectrum to obtain at least one coefficient; a memory storing a calibration function obtained by printing copies of the target pattern using a plurality of different values of the parameter and applying regression analysis to difference spectra obtained from the copies of the target pattern; and a calculator configured to calculate a value for the parameter using the coefficient and the calibration function.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
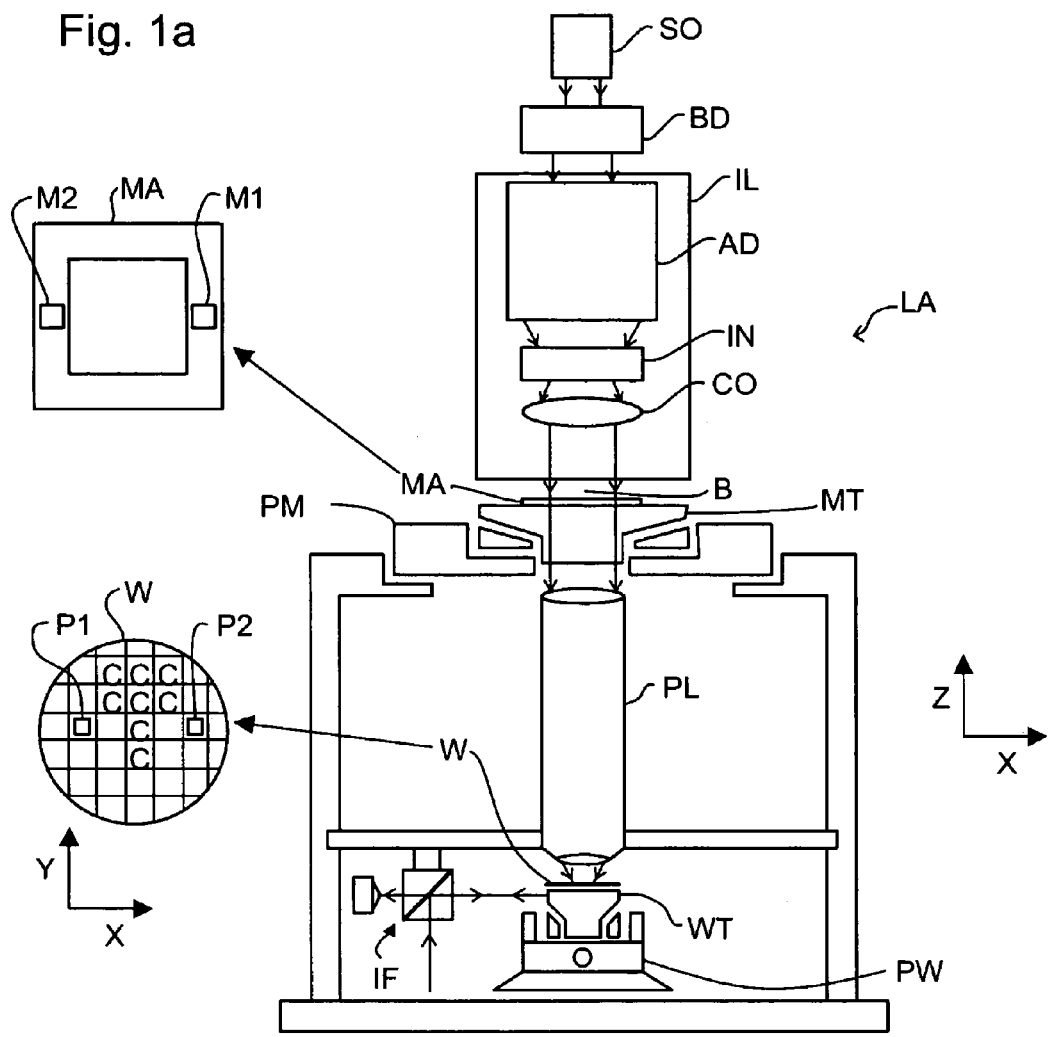
FIG. 1a depicts a lithographic apparatus according to an embodiment of the invention.

FIG. 1a schematically depicts a lithographic apparatus. The apparatus comprises an illumination system (illuminator) IL configured to condition a radiation beam B (e.g. UV radiation or EUV radiation). A support (e.g. a mask table) MT configured to support a patterning device (e.g. a mask) MA and connected to a first positioner PM configured to accurately position the patterning device in accordance with certain parameters. A substrate table (e.g. a wafer table) WT is configured to hold a substrate (e.g. a resist coated wafer) W and is connected to a second positioner PW configured to accurately position the substrate in accordance with certain parameters. A projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a, pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
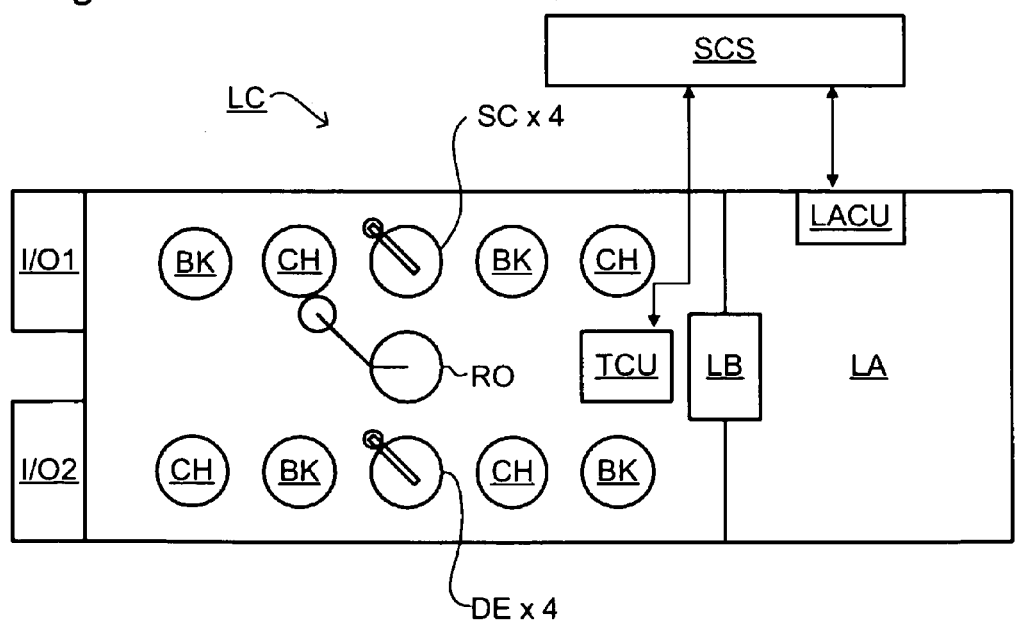
FIG. 1b depicts a lithographic cell or cluster according to an embodiment of the invention.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked, to improve yield or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 2:
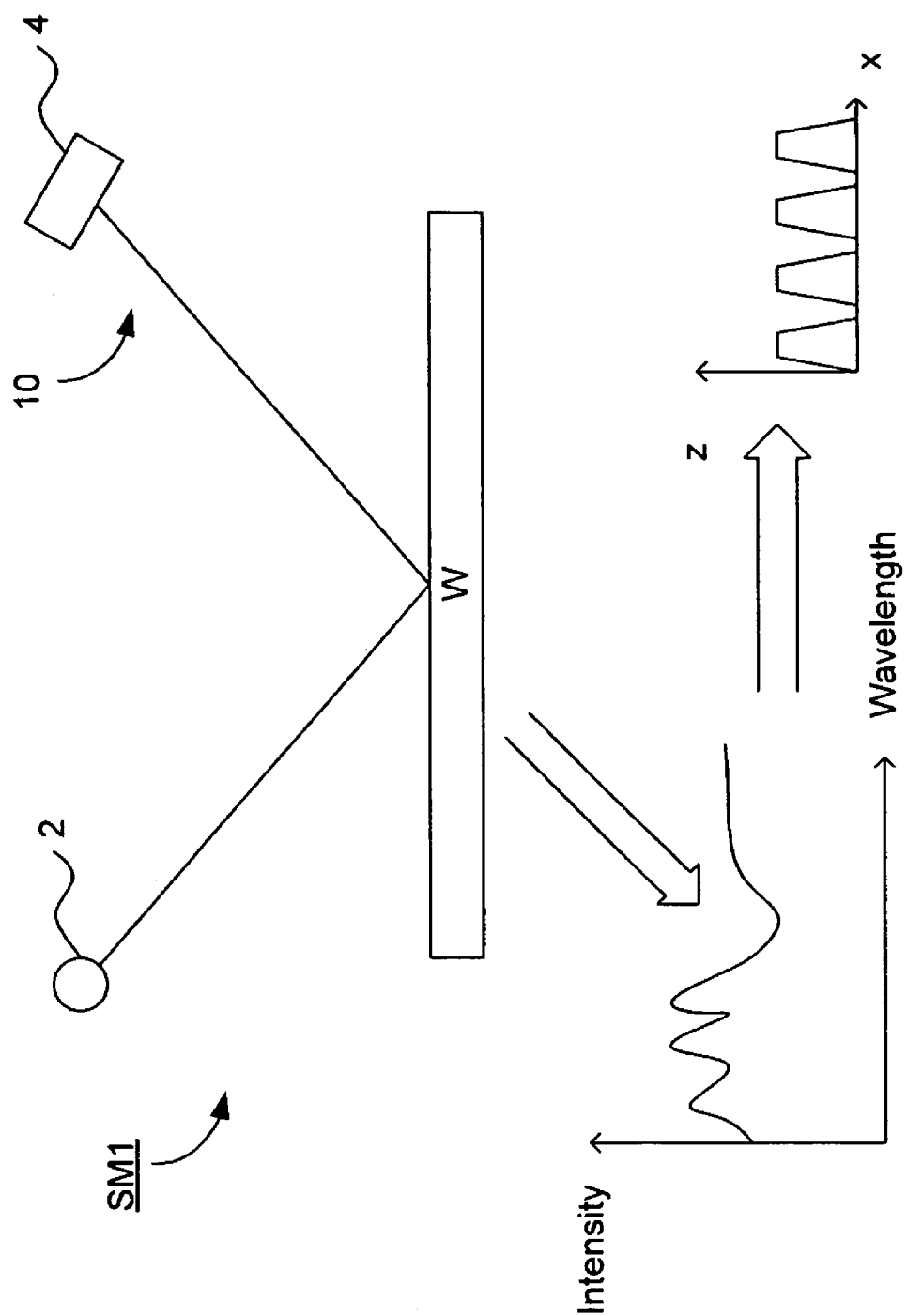
FIG. 2 depicts a first scatterometer that may be used with the invention.

FIG. 2 depicts a scatterometer which may be used in the present invention. It comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconfigured, e.g. by Rigorous Coupled Wave Analysis (RCWA) and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
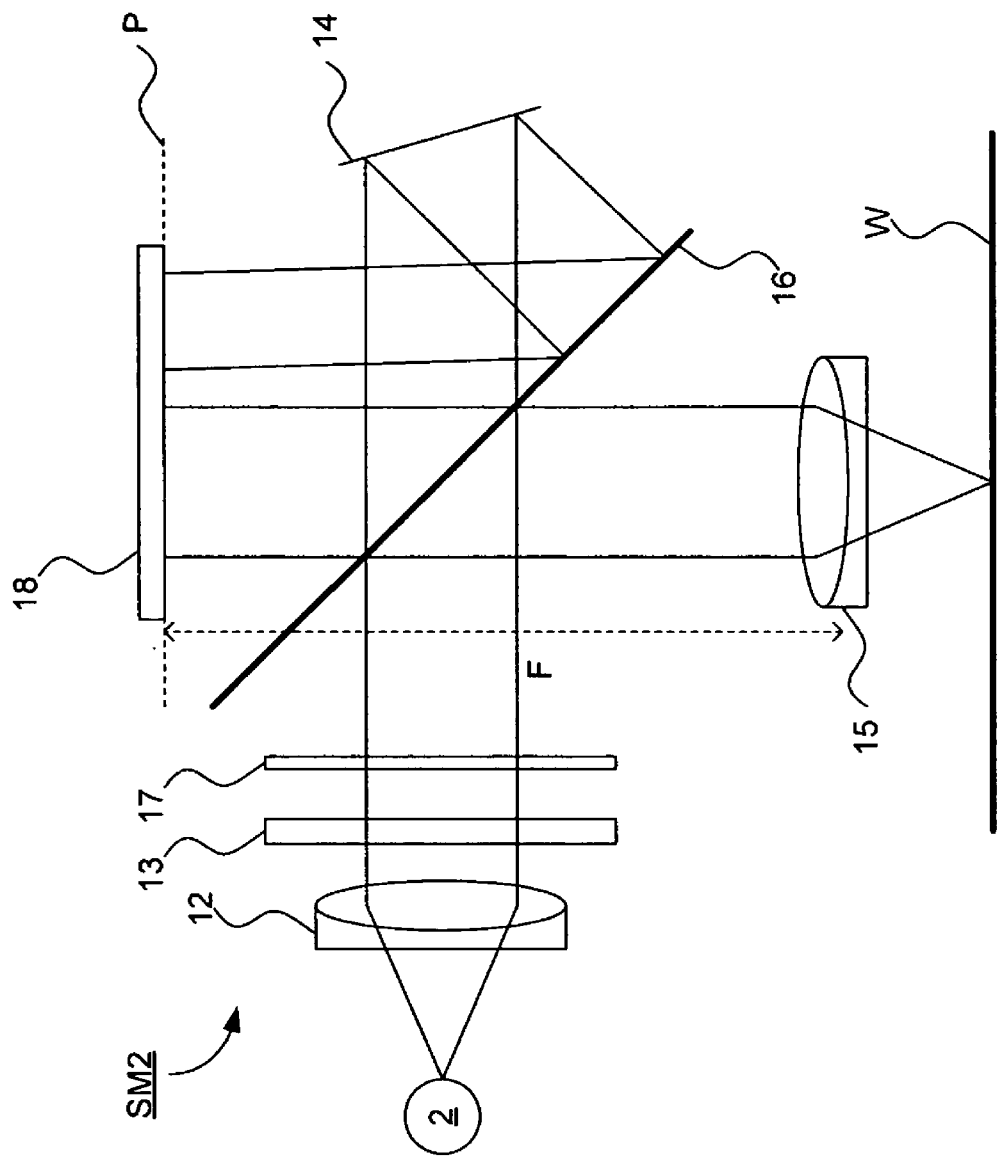
FIG. 3 depicts a second scatterometer that may be used with the invention.

Another scatterometer that may be used with the present invention is shown in FIG. 3 as SM2. In this device, the radiation emitted by radiation source 2 is focused using lens system 12 through interference filter 13 and polarizer 17, reflected by partially reflected surface 16 and is focused onto substrate W via a microscope objective lens 15, which is at a distance F from a plane P of a patterning device 18, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines the azimuth angle of the radiation. The detector is preferably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least $2\delta\lambda$ (i.e. twice the wavelength bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which document is hereby incorporated by reference.

The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberrations in the lithographic projection apparatus, etc., such that variations in the relevant parameter will manifest themselves as variations in the printed target.

Although it is possible in some circumstances to calculate relevant parameters of a printed target directly from scatterometry data by reconstructing the printed target this is always a computationally intensive task and is often impracticable. Therefore, in many methods using scatterometry calibrations are performed to derive an empirical link between scatterometry data and different values of the parameter of interest. This is the approach taken in the present invention, which is described below, with reference to FIGS. 4 to 7, by way of an exemplary method for deriving focus and dose values from scatterometry data of a printed target. The invention can be applied to other parameters of a lithographic process, such as aberrations, in a straightforward manner.

In an embodiment of the invention, the target pattern comprises two components that when printed at the ideal value of the parameter of interest are essentially identical. In the example shown the two components are gratings G1, G2 that have the same period and duty ratio but different assist, or correction, features. These are shown in more detail in the expanded part of FIG. 4. Grating G1 has bars 10 and assist features 11. The assist features 11 are sub-resolution so that they do not print but are selected to modify the focus and dose sensitivity of the bars 10 such that, for example the sensitivity of the bar width to focus variation is increased whilst the sensitivity to dose variation is decreased, and preferably substantially eliminated. Grating G2 again has bars 20 and assist features 21 but in this case the assist features are selected such as to reduce or eliminate focus sensitivity of the bars 20 and increase sensitivity to dose variation. The bar and assist feature sizes in both gratings in the mask are determined such that at a predetermined focus and dose setting, the two printed gratings will be effectively identical.

Figure 4:
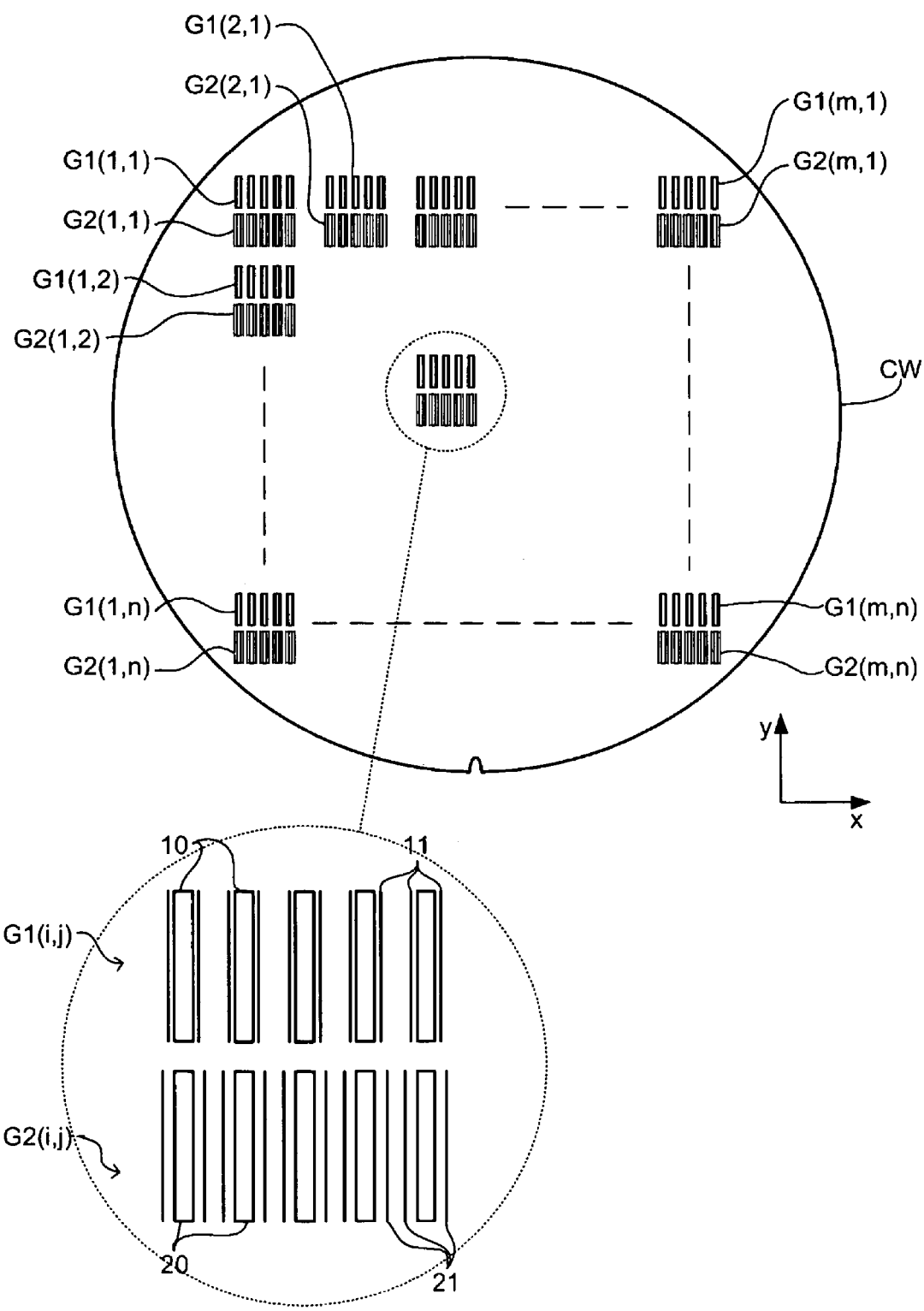
FIG. 4 depicts a calibration matrix printed on a substrate in a method according to an embodiment of the invention.

As shown in FIG. 4, the target pattern, comprising adjacent gratings G1 and G2, is printed a plurality of times in an array on a calibration substrate CW. Each different instance of the target pattern is exposed at a different combination of focus and dose settings. This is step S1 shown in FIG. 7. Conveniently the instances are configured so that in one direction in the array, e.g. x, focus varies and in the other direction, e.g. y, dose varies. The gratings can be referred to as G1(i,j) and G2(i,j) where i and j are indices running from 1 to m and n respectively, m and n may or may not be equal. Such an arrangement is known as a focus-energy matrix (FEM). In the invention, the calibration wafer may be bare silicon (or other semiconductor or substrate material) or have process layers already formed. The underlying structure on the calibration substrate should be approximately equal to the underlying structure of production substrates. The underlying structure is desirably similar across the area of the calibration array.

Figure 7:
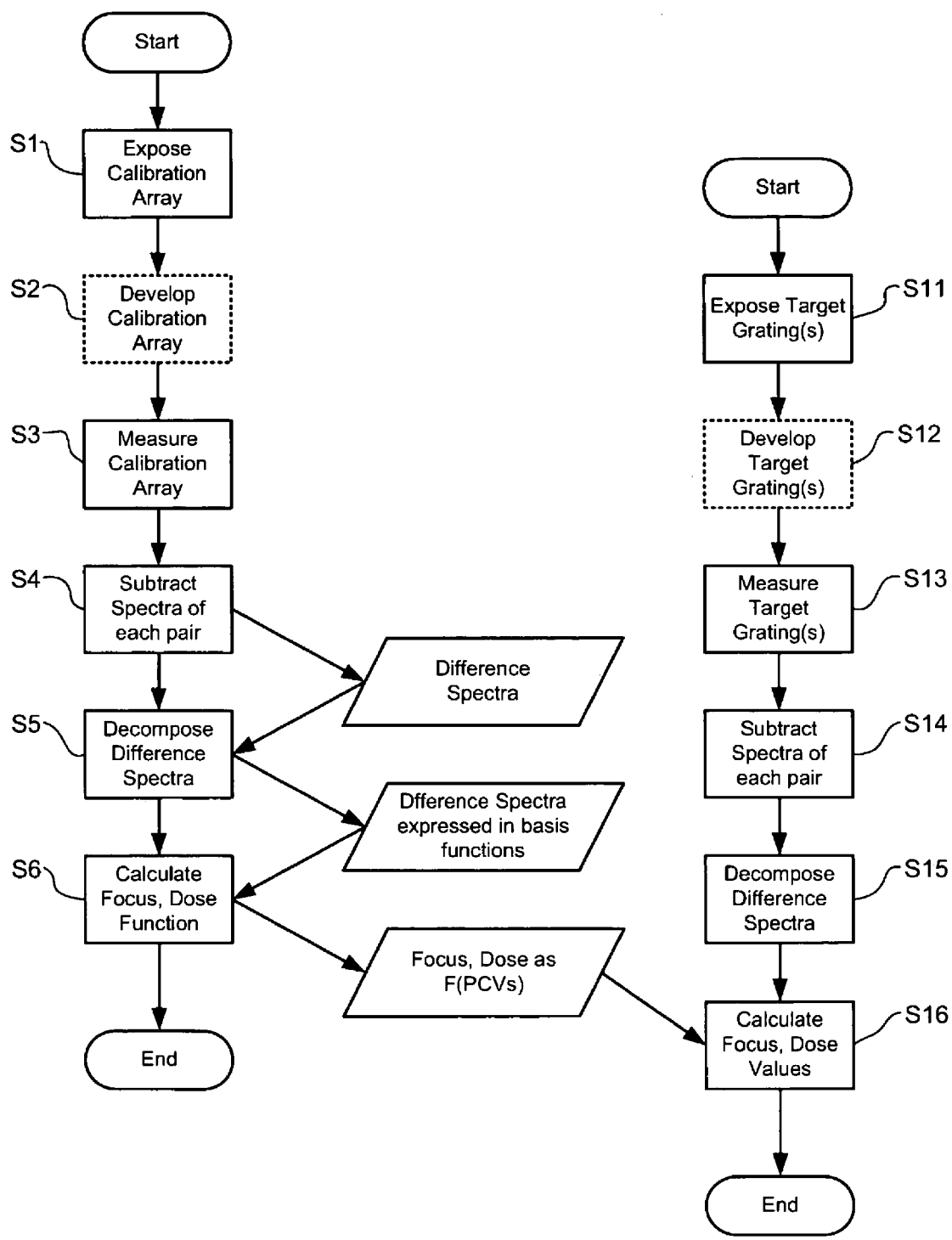
FIG. 7 is a flow chart of a method according to an embodiment of the invention.

After development of the calibration array, step S2 in FIG. 7, a scatterometer SM is used to measure spectra of each target in the array, step S3. If the scatterometer is sufficiently sensitive, the development step may be omitted, or be limited to a post-exposure bake. Conversely, the invention may be applied to patterns transferred into the substrate so that Step S2 may in that case include a pattern transfer step such as an etch. It should be noted however that measurement of production exposures, discussed further below, should be carried out on targets in the same state as used for calibration. In step S3 any suitable form of scatterometer, such as those described above, may be used.

Each pair of gratings G1, G2 provides a respective spectrum R1, R2. If an angular resolved scatterometer of the type shown in FIG. 3 is used R1 and R2 will be functions of $\theta$ and $\phi$, where $\theta$ and $\phi$ are coordinates of the pupil plane 11. Because G1 and G2 are designed such that they are effectively identical when printed with predetermined parameter values, their scatterometry spectra at those values will be identical but will vary as the parameter values, in this example focus and dose, vary from the predetermined values. Thus, R1 and R2 may be expressed as follows:

$$R1(\theta,\phi)=R0(\theta,\phi)+Z.A1(\theta,\phi)+Z^2.B1(\theta,\phi)+E.C1(\theta,\phi) \qquad (1)$$

$$R2(\theta,\phi)=R0(\theta,\phi)+Z.A2(\theta,\phi)+Z^2.B2(\theta,\phi)+E.C2(\theta,\phi) \qquad (2)$$

where R0 is the reflection spectra at the predetermined parameters and functions A1, A2, B1, B2, and C1, C2 describe for gratings G1 and G2 the spectral variations due to linear focus variation, quadratic focus variation and dose variation respectively.

Although R0 is in most cases strongly dependent on the underlying structure, the inventors have determined that in many cases functions A1, A2, B1, B2, and C1, C2 are only weakly dependent on underlying structure. Taking the difference between the two spectra yields:

$$\Delta R = R1 - R2 \quad (3)$$
$$= Z.(A1 - A2) + Z^2.(B1 - B2) + E.(C1 - C2) \quad (4)$$

From which it can be seen that the dominant error term R0 is eliminated. Thus, in this embodiment of the invention, in step S4 the two spectra obtained from each pair of gratings are subtracted to provide a set of difference spectra.

The difference spectra are used as input for the principal component analysis: first the difference spectra are decomposed and expressed in a suitable set of basis functions (step S5), then the relationship between focus and dose values and principal component values is obtained (step S6). The latter function is more robust, in that it is less sensitive to variations in the underlying structure, than a function derived from single spectra. Other related regression techniques may also be employed, examples include non-linear principal component analysis, partial least squares analysis and non-linear partial least squares modeling.

Figure 5:
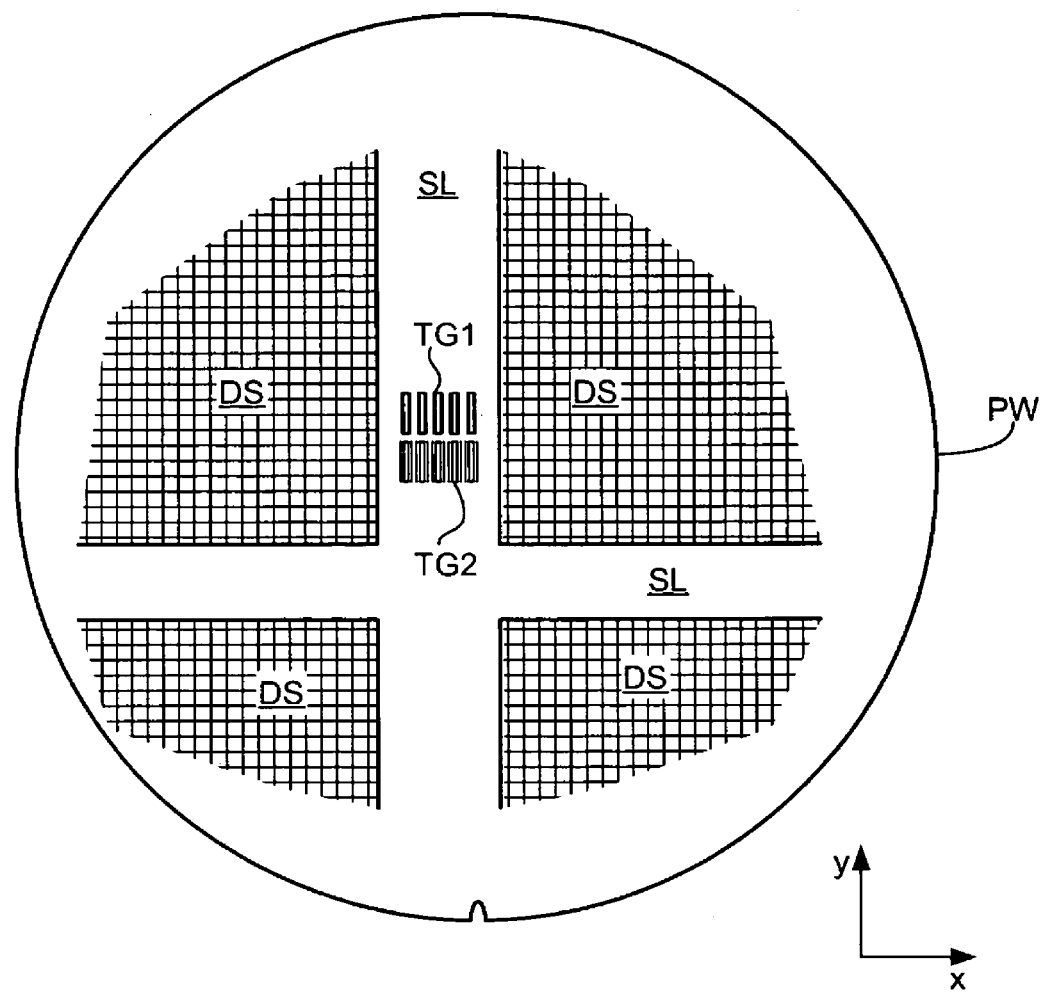
FIG. 5 depicts a target printed on a production substrate in a method according to an embodiment of the invention.
Figure 6:
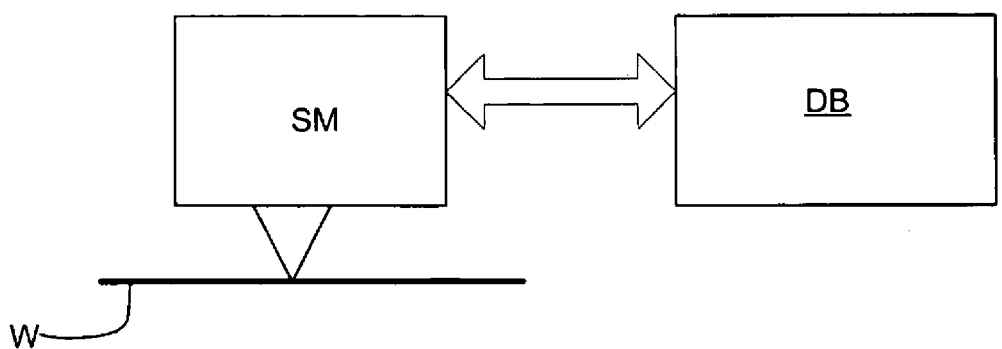
FIG. 6 depicts an inspection tool according to an embodiment of the invention.

To make measurements, a corresponding process, also illustrated in FIG. 5, is followed. A pair of target gratings TG1, TG2, identical in form to the calibration gratings G1, G2, are exposed in step S11 onto a production substrate PW during the course of a production exposure, for example in a scribe lane SL between device structure DS. The two gratings do not need to be large to enable a suitable spectrum to be obtained so that there is no excessive use of silicon real estate. If the calibration was performed on developed or semi-latent patterns the resist is developed or a post-exposure bake performed, step S12, otherwise these steps are deferred.

In step S13 the scatterometer SM is used to obtain spectra from each of the two gratings TG1, TG2 and these are then subtracted in step S14 to obtain a difference spectrum. As in the calibration process, the difference spectrum is subjected to principal component analysis: it is decomposed (step S15) into a set of coefficients (principal component values) from which can be obtained (step S16) focus and dose values by using the function derived in step S6, which is stored in a database DB, shown in FIG. 6, to which the scatterometer is connected.

Figure 8:
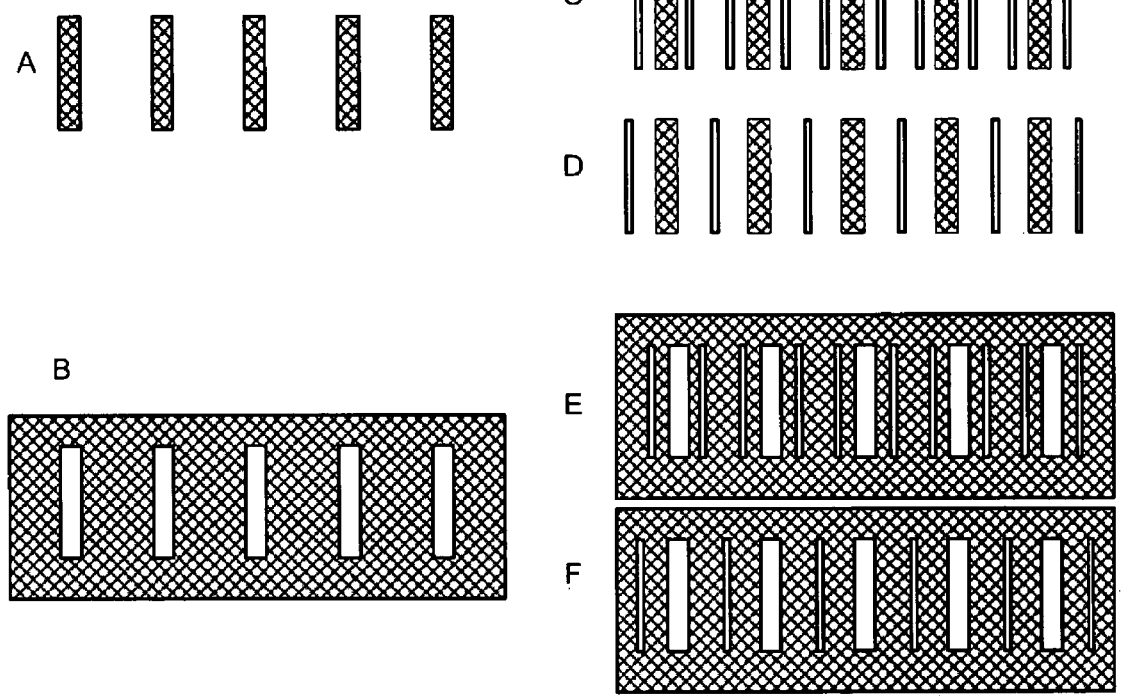
FIG. 8 depicts test patterns used in an example of a method according to an embodiment of the invention.
Figure 9:
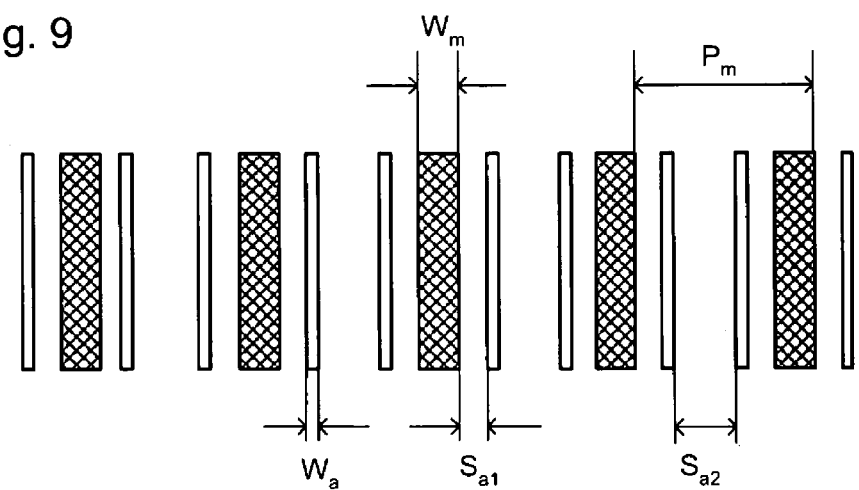
FIG. 9 depicts dimensions that can be varied in a test pattern used in the example of FIG. 8.
Figure 10:
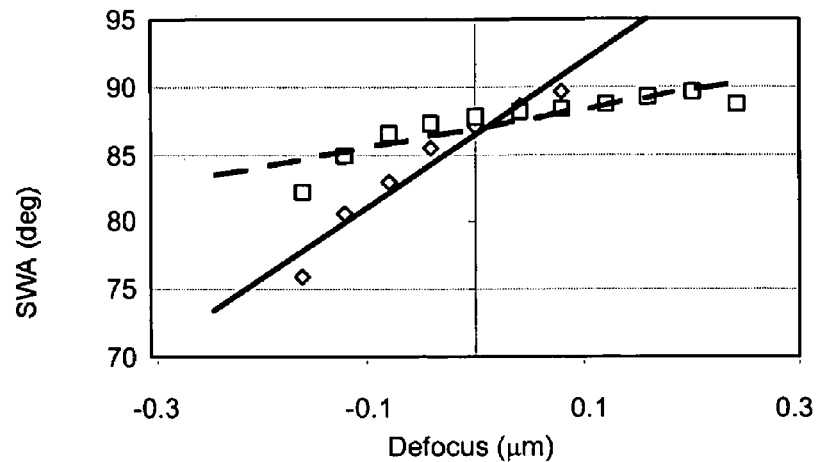
FIGS. 10 to 12 depict simulated test results in the example of FIG. 8.
Figure 11:
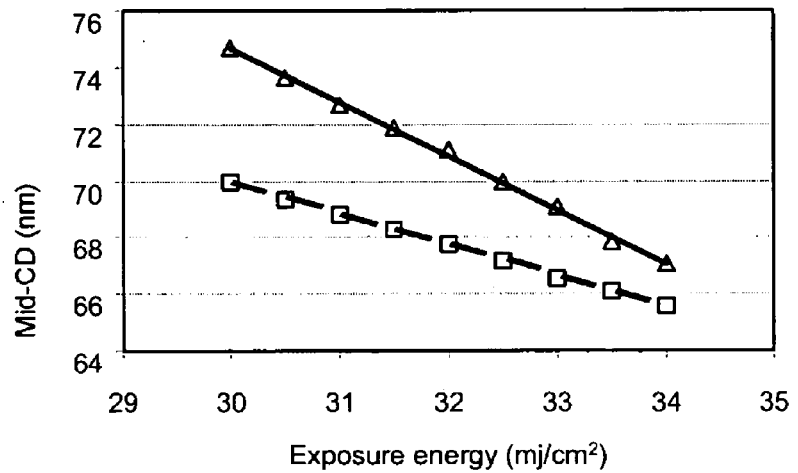
Figure 12:
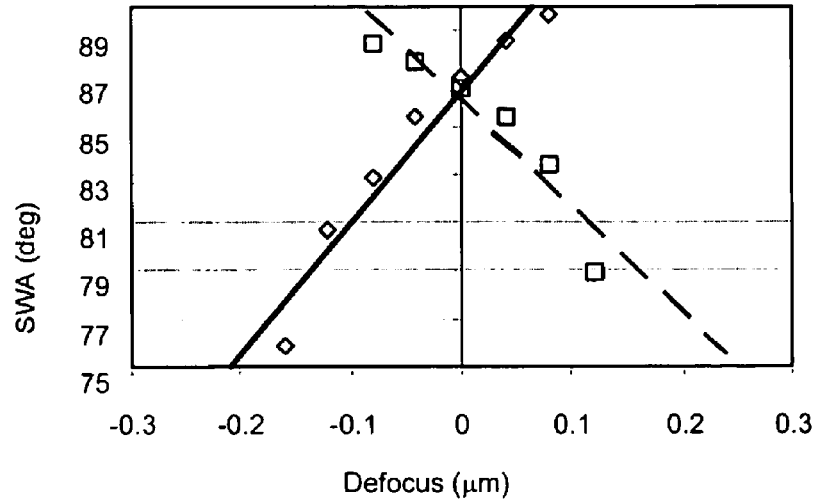

Exemplary target patterns that may be used in methods according to the invention will now be described with reference to FIGS. 8 to 12, of which FIGS. 10 to 12 show simulated results. Two reference patterns, one of positive polarity and one of negative polarity, are shown in FIG. 8 as A and B respectively and comprise a simple 1-dimensional grating formed of dark lines on a clear background or clear lines on a dark background. Assist lines are added to control focus and dose sensitivity resulting in four gratings, two of positive polarity and two of negative. These are shown as C, D, E and F in FIG. 8. Thus there are positive and negative gratings with high focus but low dose sensitivity and positive and negative gratings with low focus and high dose sensitivity. As shown in FIG. 9, the linewidth $W_a$ of the assist features and spacings $S_{a1}$ and $S_{a2}$ between assist features and main lines can be varied to achieve the desired focus and dose sensitivities. The linewidth $W_m$ and pitch $P_m$ of the main features is varied to ensure that the target pattern behavior is similar to that of device patterns to be exposed in a production exposure process.

FIG. 10 shows the sensitivity to defocus, represented by variations in sidewall angle, of the high focus-sensitivity pattern (solid line, diamonds) and the low focus-sensitivity pattern (dashed line, squares). Similarly, FIG. 11 shows the sensitivity to dose, represented by variations in mid-CD, of the high dose-sensitivity pattern (solid line, triangles) and the low dose-sensitivity pattern (dashed line, squares). FIG. 12 shows the opposite sensitivity to defocus of positive (dashed line, squares) and negative polarity (solid line, diamonds) patterns.

Since sidewall angle and mid-CD are parameters readily obtainable with scatterometers, it can be seen that patterns as described above are useful in methods of the invention.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring a parameter of a lithographic process by which a target pattern has been printed on a substrate, the method comprising:

projecting an image of a reference pattern onto a radiation-sensitive layer of a calibration substrate a plurality of times to form a plurality of calibration patterns, wherein different values of a calibration pattern parameter are used to form different ones of the calibration patterns and the reference pattern comprises first and second parts having different sensitivities to variation in the value of the calibration pattern parameter, the first and second parts of the reference pattern are selected such that, for a given value of the calibration pattern parameter, each of the first and second parts of the reference pattern form a substantially identical pattern with respect to one another in the radiation-sensitive layer;

directing an inspection beam of radiation onto the calibration patterns and measuring the radiation reflected or scattered therefrom to obtain a measurement result for each part of each calibration pattern;

subtracting the measurement result for a first part of each calibration pattern from the measurement result for a second part of the respective calibration pattern to obtain a plurality of differential measurement results;

decomposing each of the differential measurement results into a set of basis functions and associated coefficients and obtaining a relationship between values of the associated coefficients and values of the calibration pattern parameter;

projecting an image of the reference pattern onto a radiation-sensitive layer of a substrate to form a target pattern, wherein a value of a target pattern parameter used to form the target pattern is unknown;

directing an inspection beam of radiation onto the target pattern and measuring radiation reflected or scattered therefrom to obtain a target measurement result for each part of the target pattern;

subtracting the target measurement result for a first part of the target pattern from the target measurement result for a second part of the target pattern to obtain a target differential measurement result; and decomposing the target differential measurement result into a set of coefficients, multiplying a plurality of basis functions, and using a relationship between values of the associated coefficients and values of the calibration pattern parameter to determine the value of the target pattern parameter used to form the target pattern.

2. The method according to claim 1, wherein, in forming the plurality of calibration patterns, at least two values of the calibration pattern parameter of a lithographic process are varied, whereby a relationship between values of each of the values of the calibration pattern parameter and the associated coefficient values is obtained.

3. The method according to claim 1, wherein the calibration pattern parameter is focus, dose, or aberrations of a projection system used to project the image of the reference pattern.

4. The method according to claim 1, wherein a structure underlying the target pattern is different from a structure underlying the calibration patterns.

5. The method of claim 1, wherein the first and second parts of the target pattern have a substantially identical pattern to the first and second parts of the reference pattern, respectively.

6. The method according to claim 1, wherein the first and second parts of the reference pattern each comprise a main pattern and assist features.

7. The method according to claim 6, wherein the main patterns of the first and second parts of the reference pattern are substantially identical but the assist features of the first part differ from the assist features of the second part.

8. A method of obtaining a calibration function for measuring a first parameter of a lithographic process by which a target pattern has been printed on a substrate, the method comprising:

projecting an image of a reference pattern onto a radiation-sensitive layer of a calibration substrate a plurality of times to form a plurality of calibration patterns, wherein different values of a calibration pattern parameter are used to form different ones of the calibration patterns and the reference pattern comprises first and second parts having different sensitivities to variation in the different values of the calibration pattern parameter, the first and second parts of the reference pattern selected such that for a given value of the calibration pattern parameter, each of the first and second parts of the reference pattern form a substantially identical pattern with respect to one another in the radiation-sensitive layer;

directing an inspection beam of radiation onto the calibration patterns and measuring radiation reflected or scattered therefrom to obtain a measurement result for each part of each of the plurality of calibration patterns;

subtracting the measurement result for a first part of each calibration pattern from the measurement result for a second part of the respective calibration pattern to obtain a plurality of differential measurement results;

decomposing each of the differential measurement results into a set of basis functions and associated coefficients and obtaining a relationship between values of the associated coefficients and values of the calibration pattern parameter as the calibration function; and measuring the first parameter associated with the target pattern using the calibration pattern parameter.

9. A method comprising:

measuring a first parameter of a lithographic process by which a target pattern has been printed on a substrate, wherein a reference pattern comprises first and second parts having different sensitivities to variation in the value of a second parameter associated with the reference pattern, the first and second parts of the reference pattern selected such that for a given value of a calibration pattern parameter, each of the first and second parts of the reference pattern form a substantially identical pattern with respect to one another in the radiation-sensitive layer;

directing an inspection beam of radiation onto the target pattern and measuring radiation reflected or scattered therefrom to obtain a target measurement result for each part of the target pattern;

subtracting the target measurement result for a first part of the target pattern from the target measurement result for a second part of the target pattern to obtain a target differential measurement result;

decomposing the target differential measurement result into a set of basis functions and associated coefficients and using a calibration function to express a relationship between values of the associated coefficients and values of the second parameter to determine a value of the first parameter used to form the target pattern.

10. A device manufacturing method, comprising:

projecting an image of a device pattern and a reference pattern onto a radiation-sensitive layer of a substrate to form a device layer including device structures and a target pattern using a lithographic process, wherein the reference pattern comprises first and second parts having different sensitivities to variation in a value of a first parameter associated with the reference pattern, the first and second parts of the reference pattern selected such that for a given value of a calibration pattern parameter, each of the first and second parts of the reference pattern form a substantially identical pattern with respect to one another in the radiation-sensitive layer;

directing an inspection beam of radiation onto the target pattern and measuring radiation reflected or scattered therefrom to obtain a target measurement result for each part of the target pattern;

subtracting the target measurement result for a first part of the target pattern from the target measurement result for a second part of the target pattern to obtain a target differential measurement result;

decomposing the target differential measurement result into a set of coefficients, multiplying a plurality of basis functions, and using a calibration function to express a relationship between values of the coefficients and values of the first parameter to determine the value of a second parameter used to form the target pattern.

11. The method according to claim 10, further comprising accepting or rejecting the device layer based upon the determined value of the second parameter.

12. The method according to claim 10, further comprising repeating the projecting, wherein in the repeated projecting a nominal value of a third parameter is varied based upon the determined value of the second parameter.

* * * * *